United States Patent
Mei et al.

(10) Patent No.: US 9,629,252 B2
(45) Date of Patent: *Apr. 18, 2017

(54) PRINTED ELECTRONIC COMPONENTS ON UNIVERSALLY PATTERNED SUBSTRATE FOR INTEGRATED PRINTED ELECTRONICS

(71) Applicant: Palo Alto Research Center Incorporated, Palo Alto, CA (US)

(72) Inventors: Ping Mei, San Jose, CA (US); Tse Nga Ng, Sunnyvale, CA (US); Gregory Whiting, Menlo Park, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 7 days.

This patent is subject to a terminal disclaimer.

(21) Appl. No.: 14/568,620

(22) Filed: Dec. 12, 2014

(65) Prior Publication Data
US 2016/0174384 A1    Jun. 16, 2016

(51) Int. Cl.
| | |
|---|---|
| H05K 7/00 | (2006.01) |
| H05K 3/12 | (2006.01) |
| H01L 51/00 | (2006.01) |
| H05K 1/02 | (2006.01) |
| H05K 1/16 | (2006.01) |
| H05K 1/09 | (2006.01) |

(52) U.S. Cl.
CPC ......... *H05K 3/125* (2013.01); *H01L 51/0005* (2013.01); *H05K 1/0287* (2013.01); *H05K 1/16* (2013.01); *H05K 1/092* (2013.01); *H05K 2201/10166* (2013.01)

(58) Field of Classification Search
USPC ........................................ 361/782, 783, 760
See application file for complete search history.

(56) References Cited

U.S. PATENT DOCUMENTS

| | | | |
|---|---|---|---|
| 7,932,802 B2 | 4/2011 | Wei et al. | |
| 2005/0071969 A1* | 4/2005 | Sirringhaus | B82Y 30/00 29/4.51 |

OTHER PUBLICATIONS

Sami Myllymaki et al., "Radio Frequency Characteristics of Printed Meander Inductors and Interdigital Capacitors", Jpn. J. Appl. Phys. 52 (2013) 05DC08.

* cited by examiner

*Primary Examiner* — Andargie M Aychillhum
(74) *Attorney, Agent, or Firm* — Marger Johnson

(57) ABSTRACT

A circuit can include a pre-patterned substrate having a supporting material, multiple segments thereon, and inter-digitated line structures within each segment. Some of the line structures can be bundled together, and an electrical component can be formed by ink jetting onto the bundled line structures.

12 Claims, 6 Drawing Sheets

PRINTED ELECTRONIC COMPONENTS ON UNIVERSALLY PATTERNED SUBSTRATE FOR INTEGRATED PRINTED ELECTRONICS

CROSS-REFERENCE TO RELATED APPLICATIONS

This application may be found to be related to U.S. patent application Ser. No. 14/152,183, titled PRE-FABRICATED SUBSTRATE FOR PRINTED ELECTRONIC DEVICES and filed on Jan. 10, 2014.

TECHNICAL FIELD

The disclosed technology relates to the field of printed electronics and, more particularly, to generating one or more printed electronic components on a universally patterned substrate.

BACKGROUND

Solution-based all-additive printing processes may be used to enable low-cost fabrication of electronic devices on a large-area flexible substrate. Such printing processes generally offer several advantages, including fast prototyping with on-demand custom device and patterning devices at low temperatures, and may also apply to a broad range of applications for electronic device manufacture.

Demand continues to drive improvements to fabricate faster, smaller, and lower-cost devices having a higher integrated circuit density. Many of these printing processes use organic semiconductors such as organic thin-film transistors (TFTs), which have low electron or hole mobility. Because of this low mobility, the desired device performance requires a large ratio of the TFT channel width to channel length.

SUMMARY

According to aspects illustrated herein, there is provided a circuit comprising a pre-patterned substrate that includes a supporting material, a plurality of segments on the supporting material, and a plurality of interdigitated line structures within each segment, wherein some of the interdigitated line structures are bundled together. The circuit may also include at least one electrical component formed by ink jetting onto the bundled line structures.

DETAILED DESCRIPTION

Embodiments of the disclosed technology generally allow for high performance of various types of organic thin film transistor circuits and flexible configuration for digital processing by such circuits. A universally patterned substrate may be used for applications beyond transistors. For example, such a substrate may be used for ink jetted resistors for specified resistance values. The patterned substrate may also be used for patterning inductors and capacitors, thus completing the set of passive components.

Figure 1:
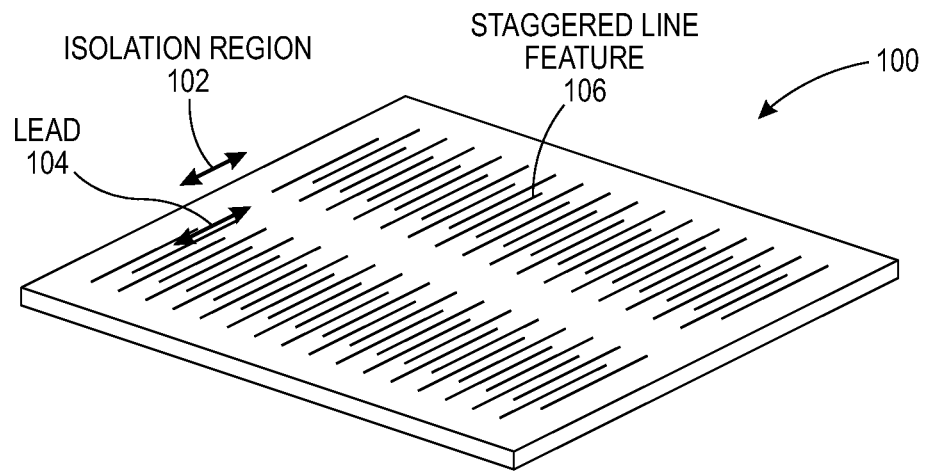
FIG. 1 illustrates a perspective view of an example of a prefabricated and universally patterned substrate for high performance printed electronics in accordance with certain embodiments of the disclosed technology.

FIG. 1 illustrates a perspective view of an example of a prefabricated and universally patterned substrate 100 for high performance printed electronics in accordance with certain embodiments of the disclosed technology. The substrate 100 enables an additive printing process to produce desired devices and circuit patterns with critical dimensions much smaller than the limitations of conventional printing process. The generically designed pre-patterned substrate 100 includes periodic segments of repetitive patterns of interdigitated line structures 106, e.g., in micrometer or nanometer scale. These patterns may be used to form transistor channels by printing semiconductor inks over the fine features without a critical alignment with the substrate 100.

In the example, the substrate 100 may consist of a supporting material such as various types of plastics, glass substrates, silicon wafers or steel foils. The substrate 100 may optionally include an insulating buffer layer. A series of segments may each include a set of pre-patterned lines 106. The lines 106 may consist of conductive materials such as silver, gold, platinum, or aluminum, for example. These interdigitated lines 106 may be staggered such that the contacts for certain staggered lines are to one side of the segment and the contacts for the other staggered lines are to the other side of the segment. An isolation region 102 may reside between the segments to allow the contacts for the lines to be printed. The dimension of the isolation region 102 between the segments may range from a few tens of micrometers to a few millimeters.

Figure 2:
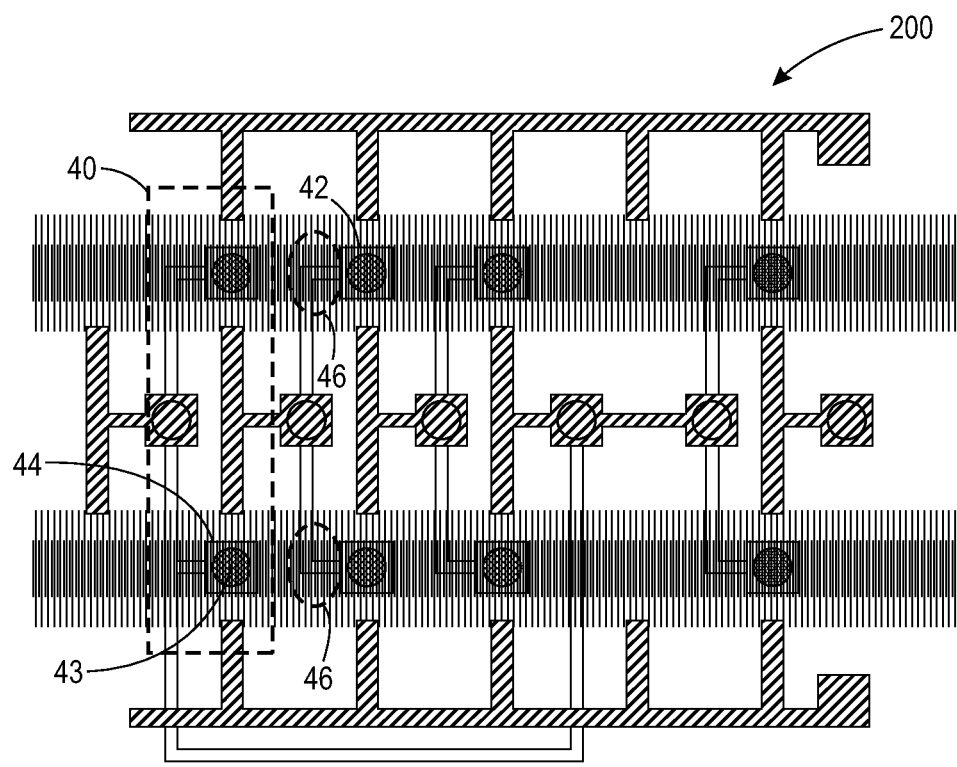
FIG. 2 illustrates an example of a CMOS ring oscillator design for an all-additive printing process performed on a universal pre-patterned substrate, such as the substrate illustrated by FIG. 1, in accordance with certain embodiments of the disclosed technology.

FIG. 2 illustrates an example of a complementary organic or metal-oxide-semiconductor ring oscillator 200 made by ink jetting on a universally patterned substrate, such as the substrate 100 illustrated by FIG. 1. In the example, the CMOS ring oscillator 200 includes an inverter 40. Patterns of source-drain connection traces may be formed by silver ink jetting on the substrate (in gray). These patterns not only serve as connections between organic TFTs at the lower source-drain level, but also define the TFT channel location and channel width by bundling some of the leads on both sides of a segment.

The length of the leads may have a range of a few micrometers to a few hundred micrometers, e.g., large enough to allow tolerance of printing resolution for the ink jet to place the conductive traces to connect the number of leads. In this example, p-type TFTs may be formed from p-type ink, such as 42 shown at the top of the circuit 200, and n-type TFTs may reside on the bottom, formed from n-type ink such as 43. The isolation regions between the segments generally allow printing of the conductive traces to connect various TFT source and drain contacts. The rest of the processes may include gate dielectric coating, via formation for vertical interconnection, and gate level patterning.

In the example, the gate of transistor 42 and 44 are connected through area 46. Since these parallel lines in the segment are isolated when they are not bundled, the gate lines passing through this area do not overlap with the source drain electrode and therefore do not contribute to the overlap parasitic capacitance. A via may allow for source/drain bottom metal to the gate top metal connection. Wherever the area where the lines are not bundled can be used for various connections which make the universally patterned substrate reconfigurable for various types of circuits. If required, these areas may be used for vertical or lateral metal connections.

Figure 3A:
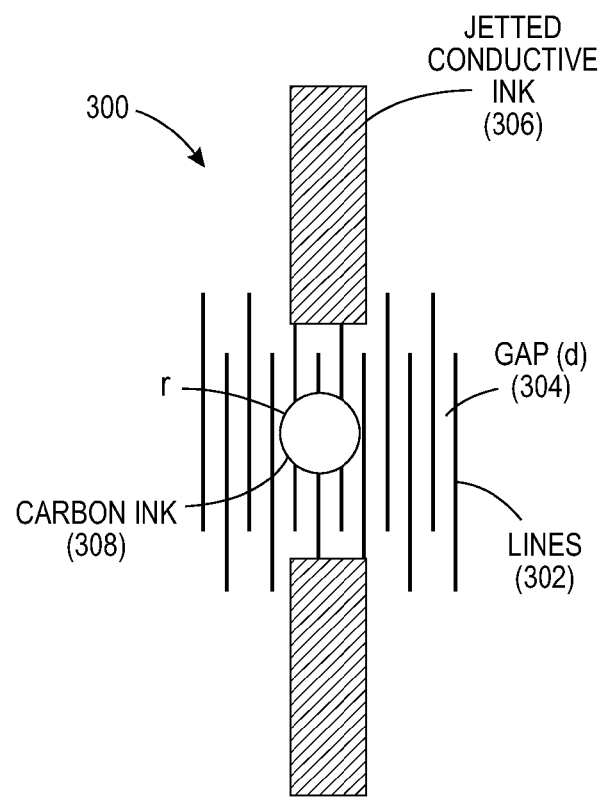
FIGS. 3A and 3B together illustrate an example of jetting carbon ink onto a bundle of interdigitated lines on a substrate, such as the substrate illustrated by FIG. 1, to form parallel resistors in accordance with certain embodiments of the disclosed technology.
Figure 3B:
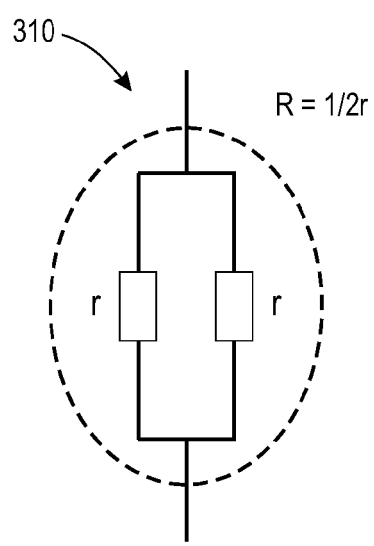

FIGS. 3A and 3B together illustrate an example 300 of jetting carbon ink 308 onto a bundle of interdigitated lines 302 on a universally patterned substrate, such as the substrate 100 illustrated by FIG. 1, to form a resistance 310 that includes parallel resistors r in accordance with certain embodiments of the disclosed technology.

In situations where the desired resistance value is low and carbon ink conductivity is high, conductive ink may first be jetted 306 to bundle several leads of the interdigitated lines 302 to form the parallel resistors r to archive the desired resistance value R=r/n where r represents the resistance across each gap on the line and n represents the total number of lines bundled.

Alternatively, the conductive jetting may be offset to obtain a resistance that is less than r/n. Since the pre-patterned lines may be high resolution, e.g., in nanometer range, the precision of the resistance value may be high.

Figure 4A:
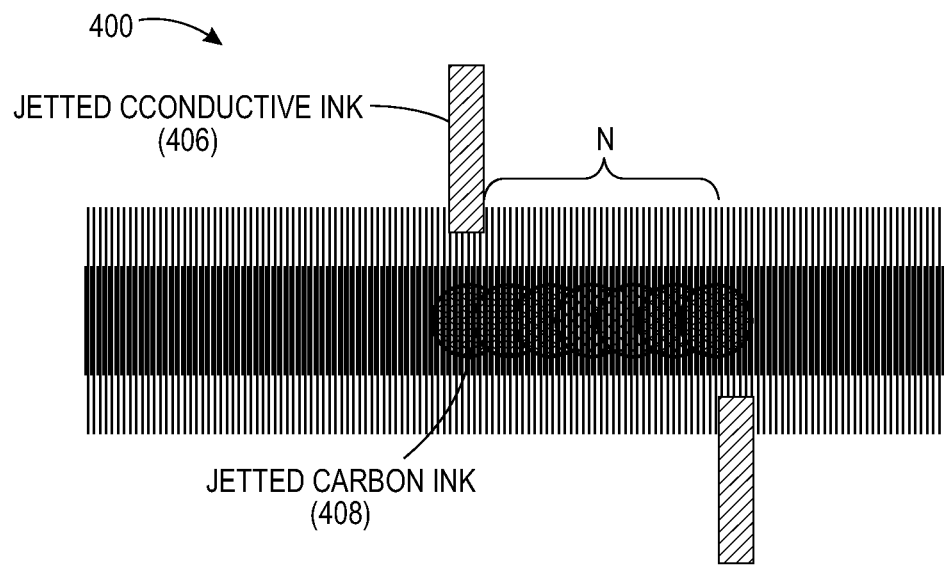
FIGS. 4A and 4B together illustrate an example of making a resistor having a high resistance value and a serial connection on a universally patterned substrate, such as the substrate illustrated by FIG. 1, in accordance with certain embodiments of the disclosed technology.
Figure 4B:
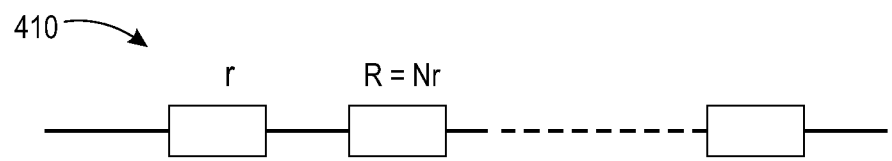

FIGS. 4A and 4B together illustrate an example 400 of generating a resistance R 410 having a high resistance value and a serial connection on a universally patterned substrate, such as the substrate 100 illustrated by FIG. 1, in accordance with certain embodiments of the disclosed technology. In the example, the resistance R is equivalent to a serial connection of the resistor across each gap, e.g., N*r, resulting from the jetting of carbon ink 408 onto the substrate.

Figure 5:
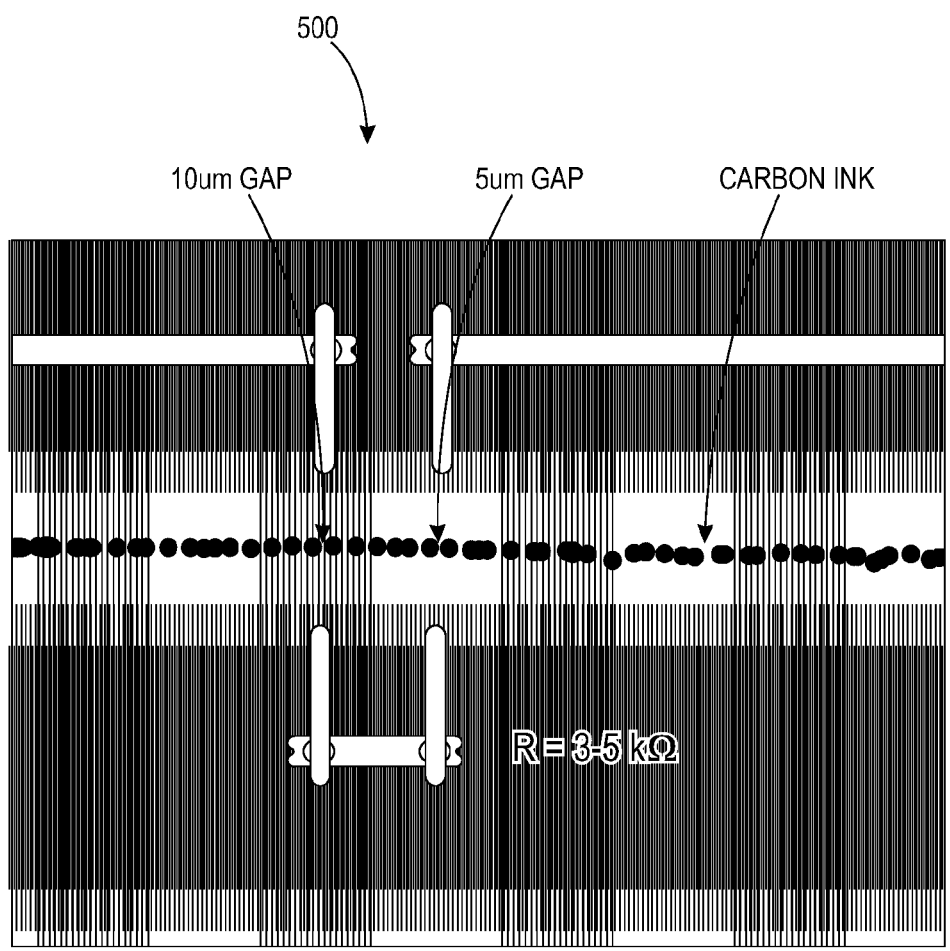
FIG. 5 illustrates an example of making a resistor having a resistance of 4.7 k-ohms on a substrate, such as the substrate illustrated by FIG. 1, in accordance with certain embodiments of the disclosed technology.

There are a variety of configurations that may be used to make parallel, serial, or combination connections to achieve a desired resistance. FIG. 5 illustrates an example 500 of making a resistor having a resistance of 4.7 k-ohms on a substrate, such as the substrate 100 illustrated by FIG. 1, in accordance with certain embodiments of the disclosed technology. In order to obtain this specific value, a few leads having a line gap of 5 um and 10 um may bundled by Ag ink jetting. These two resistors may then be connected in serial to provide a total resistance ranging between 3-5 k-ohms. The resistance can be varied based on the printing pattern.

Figure 6A:
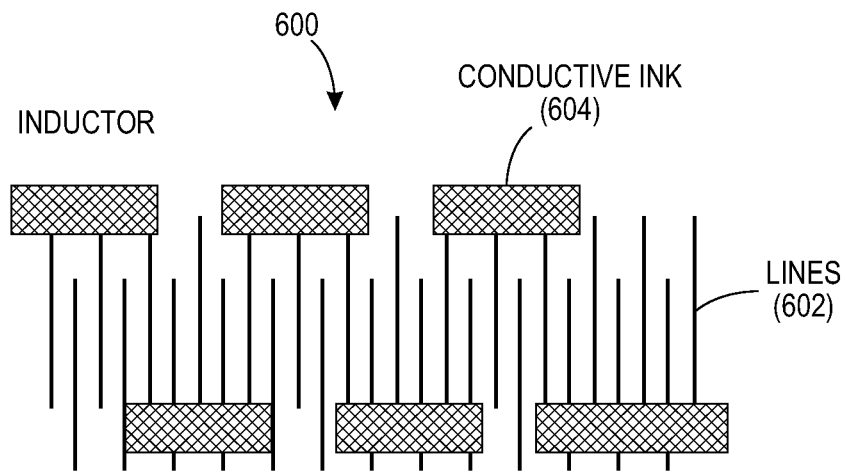
FIGS. 6A and 6B together illustrate an example of constructing a meandering inductor and an interdigital capacitor by jetting conductive ink onto the lines on a pre-patterned substrate, such as the substrate illustrated by FIG. 1, in accordance with certain embodiments of the disclosed technology.
Figure 6B:
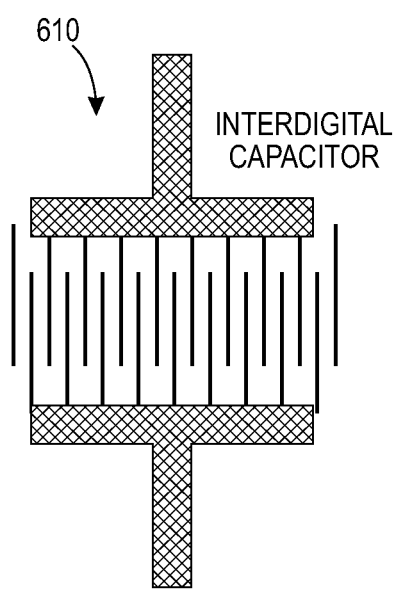

In addition to forming resistors, the techniques described herein may also be used to form inductors and capacitors on a pre-patterned substrate. FIGS. 6A and 6B together illustrate an example of constructing a meandering inductor 600 and an interdigital capacitor 610 by jetting conductive ink 604 onto the lines 602 on a pre-patterned substrate, such as the substrate 100 illustrated by FIG. 1, in accordance with certain embodiments of the disclosed technology. In the example, the inductor 600 and capacitor 610 may be readily integrated with other parts of a printed circuit.

Figure 7A:
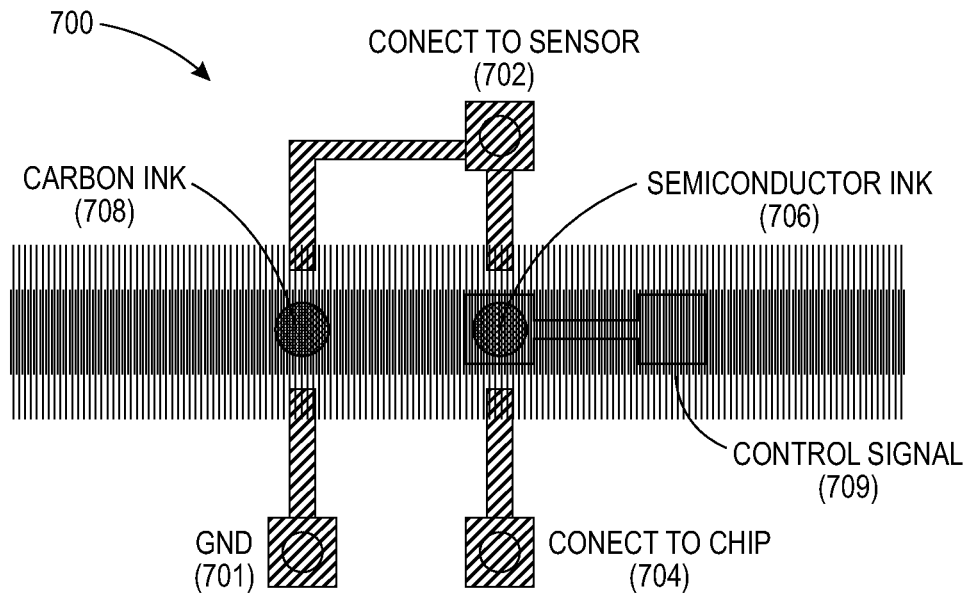
FIGS. 7A and 7B together illustrate an integration of a resistor and a transistor to form an electronic interface between a sensor device and data processing unit in accordance with certain embodiments of the disclosed technology.
Figure 7B:
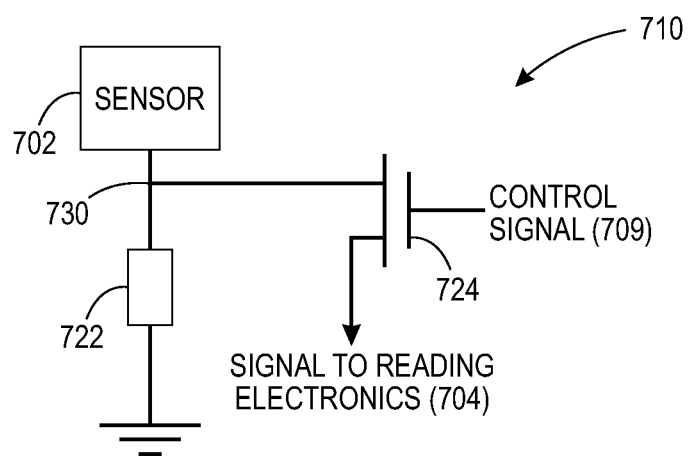

Implementations of the disclosed technology may be used for configurations to integrate resistors with various types of applications. FIGS. 7A and 7B together illustrate an integration 700 of a resistor 722 and a transistor 724 to form an electronic interface circuit between a sensor device 702 and data processing unit 704 in accordance with certain embodiments of the disclosed technology. As shown in the equivalent circuit 710, the interface receives a signal, such as a voltage or a current, at the resistor node 730. When the transistor is on upon the control signal 709, the sensor signal is transmitted to the data chip 704.

In the example, the illustrated interface circuit may be readily constructed by ink jetting on the universally patterned substrate: the semiconductor ink 706 may be jetted on the bundled interdigitated lines to form transistor channel, the carbon ink 708 may be jetted on the interdigitated lines near the semiconductor channel to form the resistor 722 with a desired resistance value, and the rest of the connections may be formed by Ag ink jetting.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A circuit, comprising:
   a pre-patterned substrate, the pre-patterned substrate including:
      a supporting material;
      a plurality of segments in direct contact with a surface of the supporting material; and
      a plurality of interdigitated parallel, coplanar lines within each segment, wherein some of the interdigitated parallel, coplanar lines are bundled together; and
   at least one electrical component formed by ink jetting onto the bundled parallel, coplanar lines.

2. The circuit of claim 1, wherein the pre-patterned substrate further includes an isolation region between the segments.

3. The circuit of claim 1, wherein the at least one electrical component includes a resistor, a capacitor, an inductor, or a memristor.

4. The circuit of claim 1, wherein the at least one electrical component includes a thin film transistor (TFT).

5. The circuit of claim 1, wherein the jetted ink is carbon ink.

6. The circuit of claim 1, wherein the bundled parallel, coplanar lines are bundled together by conductive ink jetted onto the interdigitated parallel, coplanar lines.

7. A method, comprising:
   providing a substrate;
   forming interdigitated coplanar, parallel lines in segments in direct contact with a surface of the substrate;
   bundling at least some of the parallel, coplanar lines together; and
   forming at least one electrical component by jetting ink onto the bundled parallel, coplanar lines.

8. The method of claim 7, further comprising defining isolation regions between the segments in which no interdigitated parallel, coplanar lines exist.

9. The method of claim 7, wherein the at least one electrical component includes a resistor, a capacitor, an inductor, or a memristor.

10. The method of claim 7, wherein the at least one electrical component includes a thin film transistor (TFT).

11. The method of claim 7, wherein forming the at least one electrical component includes jetting carbon ink onto the bundled parallel, coplanar lines.

12. The method of claim 7, wherein bundling at least some of the line structures together includes jetting conductive ink onto the parallel, coplanar lines.

* * * * *